US008049499B2

(12) United States Patent
Griswold et al.

(10) Patent No.: US 8,049,499 B2
(45) Date of Patent: Nov. 1, 2011

(54) CONTROLLING MULTI-CHANNEL TRANSMITTER EFFECTS ON SPECIFIC ABSORPTION RATE

(75) Inventors: Mark A. Griswold, Shaker Heights, OH (US); Jeremiah Heilman, University Heights, OH (US)

(73) Assignee: Case Western Reserve University, Cleveland, OH (US)

( * ) Notice: Subject to any disclaimer, the term of this patent is extended or adjusted under 35 U.S.C. 154(b) by 287 days.

(21) Appl. No.: 12/407,847

(22) Filed: Mar. 20, 2009

(65) Prior Publication Data

US 2010/0237869 A1    Sep. 23, 2010

(51) Int. Cl.
*G01V 3/00* (2006.01)
(52) U.S. Cl. ........................................ 324/318
(58) Field of Classification Search .......... 324/300–322; 600/410–435
See application file for complete search history.

(56) References Cited

U.S. PATENT DOCUMENTS

| | | | |
|---|---|---|---|
| 6,812,698 B1 * | 11/2004 | Tsukamoto | 324/309 |
| 6,841,999 B2 * | 1/2005 | Arneth et al. | 324/309 |
| 7,385,396 B2 * | 6/2008 | Zhu | 324/309 |
| 7,403,004 B2 * | 7/2008 | Morich et al. | 324/309 |
| 7,511,492 B2 * | 3/2009 | Sodickson et al. | 324/309 |
| 7,622,921 B2 * | 11/2009 | Fontius et al. | 324/307 |
| 7,737,690 B2 * | 6/2010 | Xu et al. | 324/307 |
| 7,795,870 B2 * | 9/2010 | Sodickson et al. | 324/309 |
| 7,860,551 B2 * | 12/2010 | Sugimoto | 600/410 |
| 7,868,618 B2 * | 1/2011 | Taniguchi et al. | 324/318 |
| 2010/0253338 A1 * | 10/2010 | Eryaman et al. | 324/309 |

OTHER PUBLICATIONS

Scott et al.; A Vector Modulation Transmit Array System; Proc. Intl. Soc. Mag. Reson. Med. 14 (2006); pp. 128.

* cited by examiner

*Primary Examiner* — Dixomara Vargas
(74) *Attorney, Agent, or Firm* — Kraguljac & Kalnay, LLC (57) ABSTRACT

Systems, methods, and other embodiments associated with controlling the specific absorption rate (SAR) in a patient associated with a conductor are described. The conductor may be, for example, a wire associated with a pacemaker, a wire associated with a neurostimulator, an orthopaedic device, and so on. One example method includes calibrating a multi-channel transmitter associated with a magnetic resonance imaging (MRI) apparatus imaging the patient. The example method also includes controlling the MRI apparatus to transmit radio frequency (RF) energy to image the patient in a manner where the RF energy will only influence the SAR near the conductor in the patient less than a desired threshold amount.

19 Claims, 8 Drawing Sheets

CONTROLLING MULTI-CHANNEL TRANSMITTER EFFECTS ON SPECIFIC ABSORPTION RATE

BACKGROUND

Magnetic resonance imaging (MRI) involves producing a magnetic field and producing radio frequency (RF) energy in the presence of a patient in the magnetic field. The patient may absorb some of this RF energy. Absorbing RF energy may cause tissue to heat up. Additionally, there may be other issues associated with magnetic fields, RF fields, and so on. Therefore various regulations, guidelines, and practicalities concern the specific absorption rate (SAR) of an MRI patient.

SAR may increase near conductors (e.g., wires) implanted in, transiting, lying on the surface of, or in contact with a patient. For example, the SAR may increase near a wire associated with an implanted pacemaker, near a wire associated with an implanted neurostimulator, near a bar being used to stabilize a fracture or other orthopaedic device, and so on. In some cases, a conductor may cause an unpredictable and unacceptable SAR increase in tissue near the conductor. Therefore, MRI may not be advisable or even available to patients having implanted wires. In some cases a conductor (e.g., wire) may experience a change in temperature of 30 degrees Centigrade in one second.

Understanding SAR depends on understanding the interaction between a field created by RF energy and a wire. Interactions between fields and conductors is controlled by the electric fields (E-fields) that accompany RF transmission. E-fields may induce a potential in a wire. One type of induction is described by:

$$V = \int E^* dx$$

where the integral is taken over the path (x) of the wire.

Conventional attempts to control MRI related SAR in patients having implanted wires have included carefully arranging patients with respect to the MRI RF coil, using low-power RF pulses, and so on. However, these approaches may have produced sub-optimal results leaving some patients without the option and benefit of MRI diagnosis. With the increasing accuracy, sophistication, speed, and ubiquity of MRI, this is a serious drawback to those patients.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Understanding SAR associated with a conductor associated with an MRI patient depends on understanding the interaction between an RF field and a wire. The interaction between the RF field and the wire is related to the E-fields that accompany RF transmission. E-fields may induce a potential in a wire. The induction is described by:

$$V = \int E^* dx$$

where the integral is taken over the path (x) of the wire. Example systems and methods produce excitations that yield a zero integral, a substantially zero integral, or an integral that is relatively minor compared to a conventional system. Example systems and methods intelligently choose E in light of the possibilities presented by using a parallel multi-channel transmitter. One example system may include a multi-ring, multi-channel transmitter. Each transmission channel in the transmitter may contribute to the overall E-field.

The multi-ring, multi-channel transmitter may produce fields, for example, similar to a spiral birdcage coil. In one example, the spiral may twist through a full rotation (e.g., $2\pi$) over the length of a wire. In this example, an excitation may be produced that induces substantially zero potential in the wire. While a full rotation is described, one skilled in the art will appreciate that other twists may be employed. Increasing the twist may create a safer excitation. However, increasing the twist may also decrease B1 magnitude and homogeneity. Example systems and methods may include a calibration or experimentation phase or apparatus to examine different excitations to determine a desired excitation. In one example, the calibration phase may try different combinations of excitations and twists to determine a desired excitation/twist combination.

Example systems and methods may also excite a subset of channels in a multi-channel transmitter in a controlled pattern that compensates for coupling associated with portions of the transmitter. For example, a multi-channel transmitter may include a set of transmission coils. A coil may have an innermost set of coils, an outermost set of coils, and intermediate coils. In one example, the outermost ring of coils can be excited in a manner that cancels coupling produced by the innermost and intermediate coils. The outermost rings may be excited, for example, contrary to the rest of the channels and with a selectively adjusted amplitude.

This specific example is one embodiment of the more general concept that excitation patterns can be produced for a multi-channel transmitter to produce E-fields that sum to yield an acceptable potential on the wire in the patient. In one example, the E-fields may sum to a net-zero potential on the wire in the patient. While a net-zero potential may be ideal for safety, it may compromise image quality beyond a desired amount. Therefore example systems and methods may automatically balance or be configurable with respect to a ratio between SAR effect and image quality. Different excitation patterns may be constrained by B1 magnitude, by B1 homogeneity, and so on. Thus, different excitation patterns may be examined during a calibration phase to facilitate selecting an excitation pattern that optimizes a trade-off between imaging quality and SAR effects.

Example systems and methods create excitation patterns that reduce, suppress, or eliminate coupling to a wire. In one example, a multi-channel transmitter can be controlled to produce excitation patterns that reduce, suppress, or eliminate coupling to a wire. Reducing the coupling to a wire can reduce undesirable effects on SAR. In one example, excitation patterns may be produced after a discovery or calibration phase. During the discovery or calibration phase, the location of a wire may be discovered and the excitation pattern may be calibrated to minimize, eliminate, or control to an acceptable level the effects on SAR.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 1:
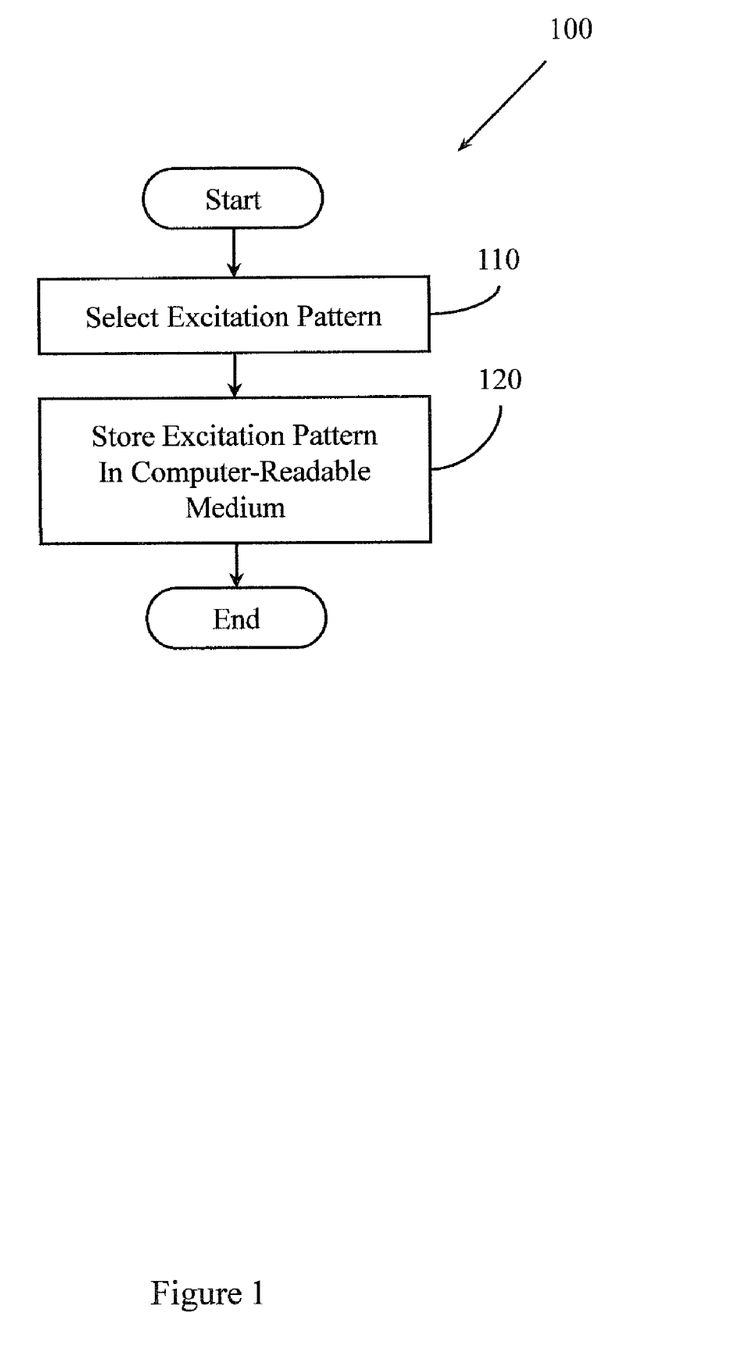
FIG. 1 illustrates an example method associated with controlling multi-channel transmitter effects on SAR.

FIG. 1 illustrates a method 100 associated with controlling multi-channel transmitter effects on SAR. Method 100 may include, at 110, controlling an MRI apparatus. The MRI apparatus includes a transmitter that has two or more transmission channels. The MRI apparatus may be configured to acquire an MR image of a portion of the patient as a function of nuclear magnetic resonance (NMR) signal emitted by the patient in response to the excitation pattern. However, acquiring the image may induce a signal in a conductor associated with the patient.

Therefore, the controlling at 110 includes controlling the MRI apparatus to select an excitation pattern for the transmitter. The transmission channels of the multi-channel transmitter are individually configurable with respect to transmitting RF energy according to individual transmission parameters. The transmission parameters may include, for example, amplitude, frequency, bandwidth, and so on. Therefore, the excitation pattern describes transmission parameters for RF energy to be transmitted from the individually configurable transmission channels. The excitation pattern is selected to control the effect of the magnetic field and/or RF energy associated with MRI on the SAR of RF energy near a conductor associated with a patient where the SAR is attributable to the conductor being exposed to a field associated with the RF energy. In one example, the excitation pattern is selected to maintain the SAR below a threshold level. Thus, generally, the excitation pattern is selected as a function of an electrical potential that would be induced in the conductor associated with the patient by a set of electric fields produced by the RF energy. The conductor associated with the patient may be, for example, a wire associated with an implanted pacemaker, a wire associated with an implanted neuro-stimulator, a surface electrode, a portion of an orthopaedic device, a vascular screen, and so on.

Method 100 may also include, at 120, storing the excitation pattern in a computer-readable medium. Storing the excitation pattern in a computer-readable medium may facilitate reducing the calibration time for the patient in a subsequent imaging session. Additionally, storing the excitation pattern may facilitate more quickly calibrating imaging sessions for patients with similarly situated conductors. Different MRI apparatus may have different transmitters. For example, a transmitter may be a multi-ring, multi-channel transmitter. Storing the excitation pattern for a given patient for a given multi-ring, multi-channel transmitter facilitates sharing data between MRI apparatus, developing analytical models for conductors, apparatus, and patients, and so on.

Recall that the interaction between the RF energy and the conductor is a function of E-fields produced by the transmission of the RF energy as described by Faraday's law. Therefore, in one example the excitation pattern is selected so that the resulting integral is below a desired amount. The desired amount may be balanced against image quality.

While FIG. 1 illustrates various actions occurring in serial, it is to be appreciated that various actions illustrated in FIG. 1 could occur substantially in parallel. By way of illustration, a first process could select an excitation pattern while a second process could store the excitation pattern. Looking ahead to FIG. 2, a third process could control an MRI apparatus to apply RF energy according to the excitation pattern. While three processes are described, it is to be appreciated that a greater and/or lesser number of processes could be employed and that lightweight processes, regular processes, threads, and other approaches could be employed.

Figure 2:
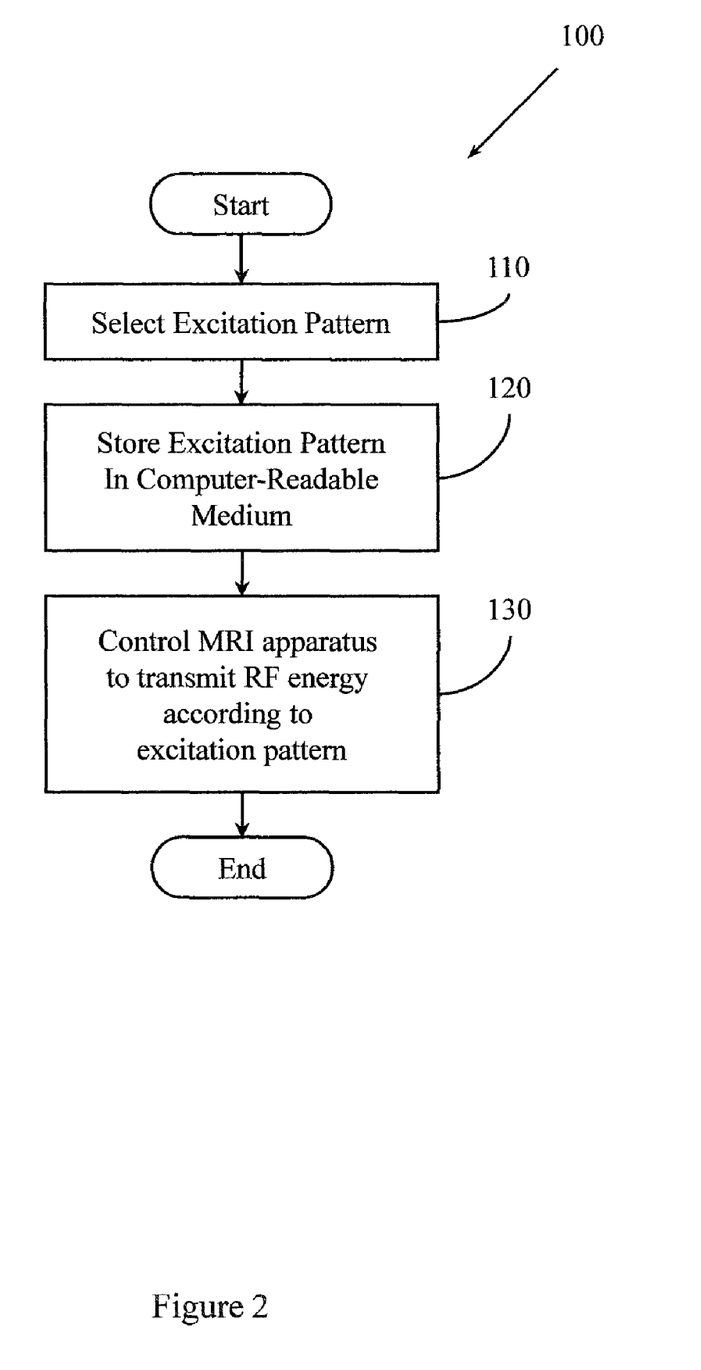
FIG. 2 illustrates an example method associated with controlling multi-channel transmitter effects on SAR.

FIG. 2 illustrates another embodiment of method 100. This embodiment includes selecting the excitation pattern at 110 and storing the excitation pattern at 120. This embodiment also includes controlling an MRI apparatus to transmit RF energy through the transmitter according to the excitation pattern. In one example of this embodiment of method 100, the method 100 may not store the excitation pattern at 120 but may instead select the excitation pattern at 110 and then directly control the MRI apparatus to apply RF energy at 130 according to the selected excitation pattern.

Figure 3:
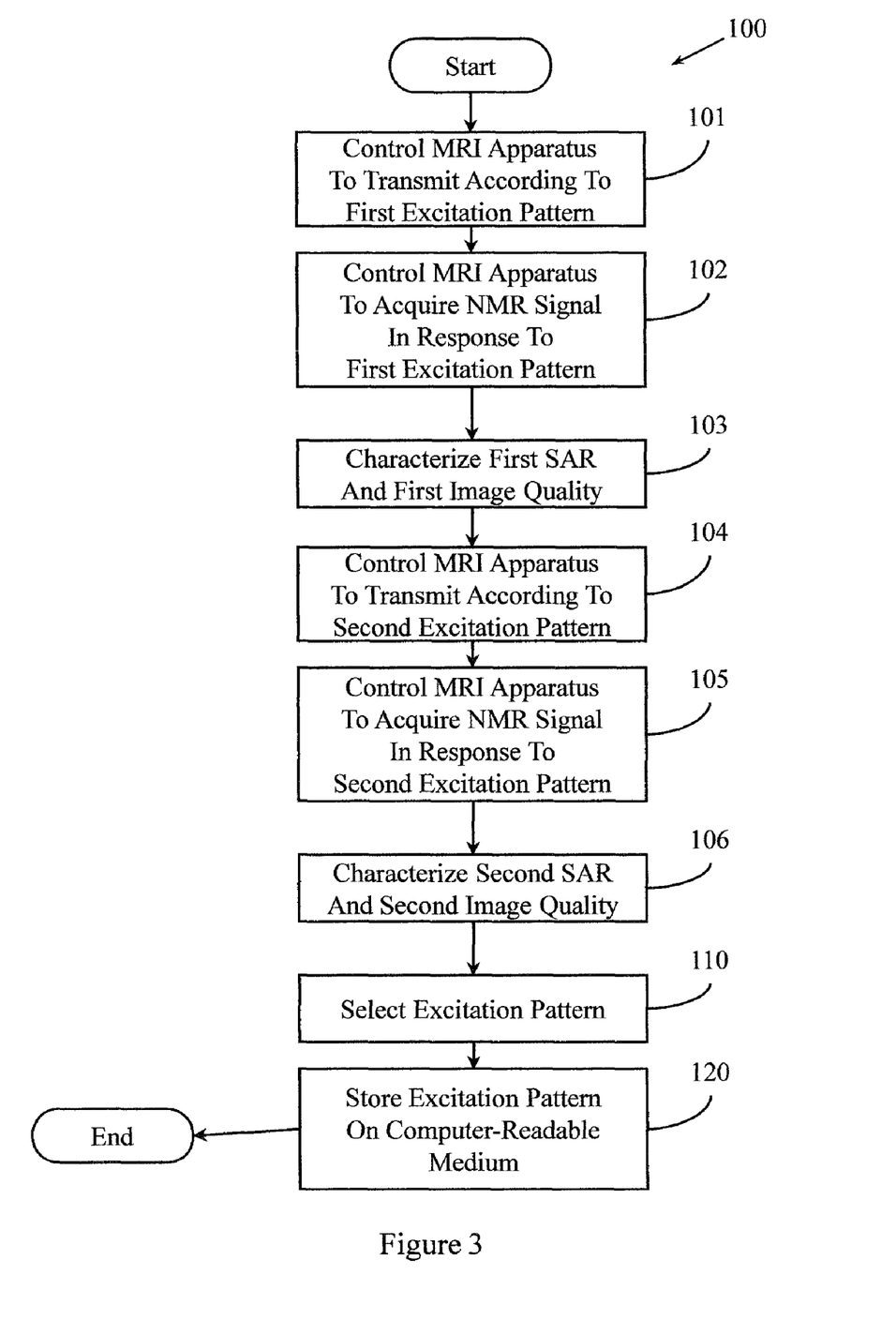
FIG. 3 illustrates an example method associated with controlling multi-channel transmitter effects on SAR.

FIG. 3 illustrates another embodiment of method 100. This embodiment includes selecting the excitation pattern at 110 and storing the excitation pattern at 120. This embodiment also describes additional detail about calibration experimentation undertaken from 101 through 106 before the excitation pattern is selected at 110.

This embodiment of method 100 includes, at 101, controlling the MRI apparatus to transmit RF energy through the transmitter according to a first excitation pattern. The first excitation pattern may include individual frequencies or individual amplitudes for each transmission channel in a multi-channel transmitter. The first excitation pattern may also include individual frequencies or amplitudes for a subset of the transmission channels in the multi-channel transmitter.

Method 100 may also include, at 102, controlling the MRI apparatus to acquire a first MR signal in response to the first excitation pattern. The first MR signal may be an NMR signal emitted by the patient associated with the conductor. The NMR signal may be emitted in response to the RF energy applied according to the first excitation pattern. The first MR signal may be analyzed with respect to, for example, image quality. The first excitation pattern may also be analyzed with respect to, for example, a first predicted SAR effect with the first MR signal. Therefore method 100 may include, at 103, characterizing the first excitation pattern with respect to image quality, SAR effect, and so on.

Method 100 may also include, at 104, controlling the MRI apparatus to transmit RF energy through the transmitter according to a second excitation pattern. Method 100 may also include, at 105, controlling the MRI apparatus to acquire a second MR signal in response to the second excitation pattern. This second MR signal may be characterized at 106 with respect to image quality, SAR effect, and so on.

One skilled in the art will appreciate that the actions illustrated at 101 through 106 may be repeated a number of times until a desired combination of image quality and SAR effect is achieved. After the calibration experiments have been performed from 101 through 106, method 100 may, at 110, select a final excitation pattern as a function of the experimentally discovered image qualities and the experimentally discovered predicted SAR effect. One skilled in the art will appreciate that if N (N being an integer greater than 1) excitation patterns are tried during the calibration phase that the final excitation pattern may be selected in light of N image qualities and N predicted SAR effects.

Figure 4:
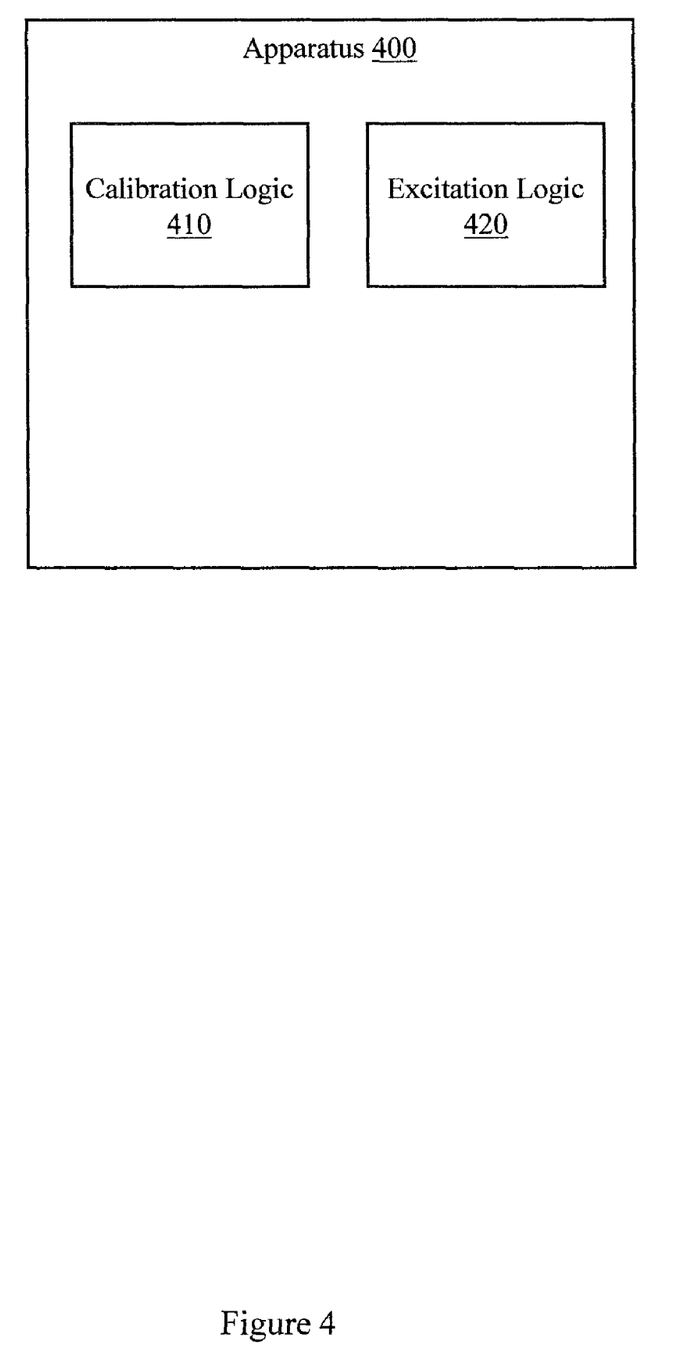
FIG. 4 illustrates an example apparatus associated with controlling multi-channel transmitter effects on SAR.

FIG. 4 illustrates an apparatus 400. Apparatus may be incorporated in an MRI apparatus. Apparatus 400 is configured to control multi-channel transmitter effects on specific absorption rate. Apparatus 400 includes a calibration logic 410. Calibration logic 410 is configured to determine a set of transmission parameters for a set of transmission channels in a multi-channel transmitter. The transmission parameters may include, for example, amplitude, frequency, bandwidth, and so on. In one example the calibration logic 410 is configured to determine the set of transmission parameters for the set of transmission channels as constrained by B1 magnitude and B1 homogeneity. In one example the calibration logic 410 is configured to first determine a set of frequencies for the set of transmission channels in the multi-channel transmitter and then to determine a set of amplitudes for the set of transmission channels in the multi-channel transmitter. The set of amplitudes are determined in light of the set of frequencies. In one example, a best-fit approach may be taken to reduce the amount of time required to calibrate the apparatus 400.

In one example, the calibration logic 410 is configured to apply a set of calibration excitation patterns as part of calibrating apparatus 400. The set of calibration excitation patterns may have different frequencies and amplitudes and may be designed to facilitate identifying an appropriate combination of frequencies and amplitudes. In different examples the calibration logic 410 may apply two excitation patterns, may apply four excitation patterns, may apply 8 excitation patterns, and so on. The calibration logic 410 is also configured to examine a set of resulting impacts on SAR. For example, if two excitation patterns are tried, then two resulting SAR impacts may be examined. Similarly, if four excitation patterns are tried, then four results SAR impacts may be examined. Excitation patterns may be examined with respect to more than just SAR impact. Consider that an excitation pattern that produces an ideal SAR situation may produce an unreadable MR image. Thus, the calibration logic 410 may be configured to select an excitation pattern that satisfies a balance between imaging quality and SAR effects.

Apparatus 400 also includes an excitation logic 420. The excitation logic 420 is configured to control the multi-channel transmitter to transmit RF energy associated with acquiring a magnetic resonance image of a patient. The RF energy through individual transmission channels is to be controlled as a result of the calibration performed by the calibration logic 410 that produced the transmission parameters associated with the final excitation pattern. Recall that RF energy transmitted through the set of transmission channels will induce a signal in a conductor associated with a patient exposed to the RF energy. Therefore the excitation logic 420 is configured to transmit the RF energy through individually configurable transmission channels according to the set of transmission parameters so that the signal induced in the conductor will be below a configurable threshold.

The excitation logic 420 may be configured to control the multi-channel transmitter to excite a subset of transmission channels in the multi-channel transmitter in a controlled pattern that compensates for coupling associated with portions of the multi-channel transmitter. In one example the configurable threshold is a SAR threshold. Therefore the excitation logic 420 may be configured to control the multi-channel transmitter to produce E-fields that sum to yield a potential on the wire in the patient that is less than the SAR threshold.

Figure 5:
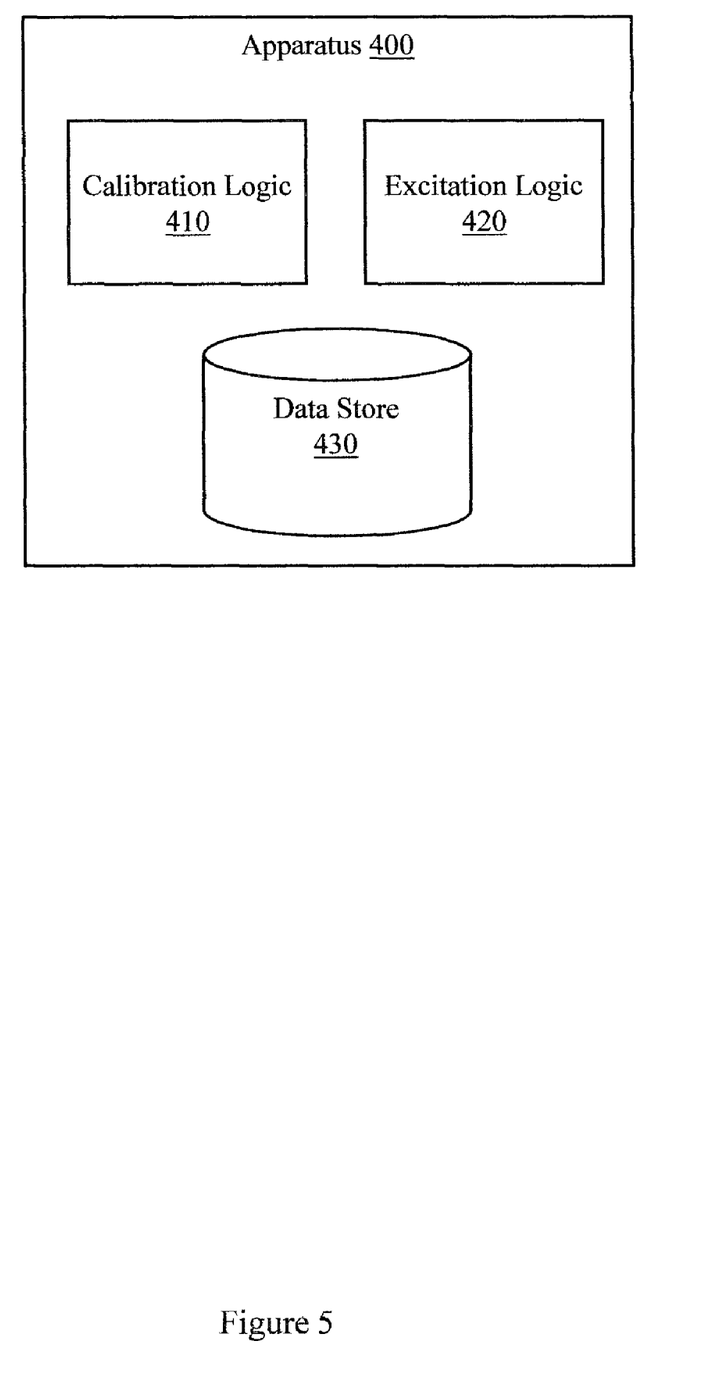
FIG. 5 illustrates an example apparatus associated with controlling multi-channel transmitter effects on SAR.

FIG. 5 illustrates another embodiment of apparatus 400. This embodiment includes the calibration logic 410 and the excitation logic 420. This embodiment also includes a data store 430. The data store 430 is configured to store the transmission parameters. A patient may have more than one MR image taken over time. By storing the transmission parameters, the time required to perform a future calibration may be reduced. Also, one patient may have a conductor positioned in a similar position to another patient. Once again the time required to perform a future calibration may be reduced by considering previous transmission parameters calibrated from similarly situated patients.

Figure 6:
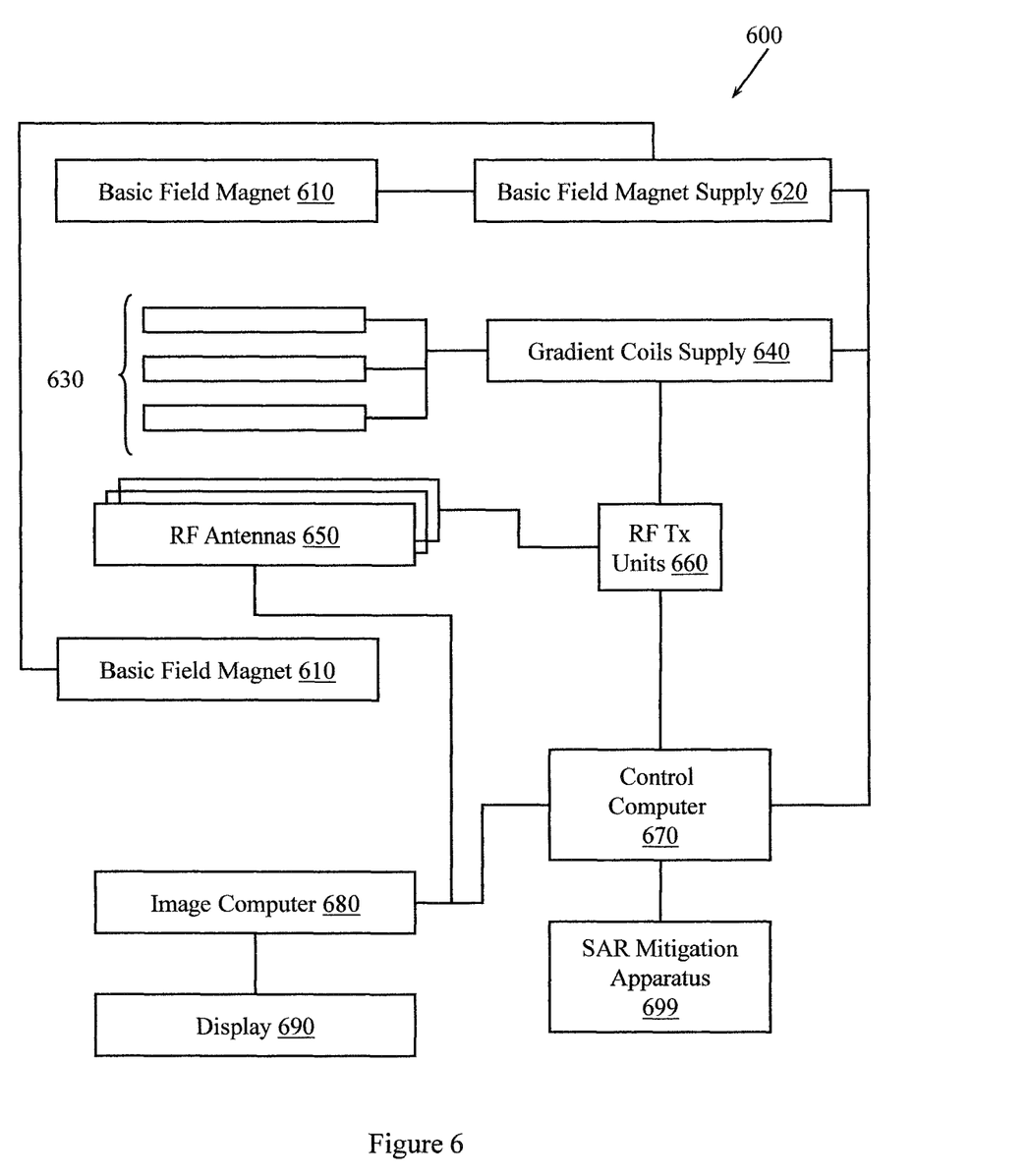
FIG. 6 illustrates an MRI apparatus associated with controlling multi-channel transmitter effects on SAR.

FIG. 6 illustrates an example MRI apparatus 600 configured with an SAR-mitigation apparatus 699 that is configured to facilitate controlling multi-channel transmitter effects on SAR. In one example, SAR-mitigation apparatus 699 may be configured to reduce the effect on SAR due to a potential induced in a conductor in patient in response to MRI. The SAR-mitigation apparatus 699 may be configured with elements of example apparatus described herein and/or may perform example methods described herein. Thus, in one example, SAR-mitigation apparatus 699 may provide means (e.g., hardware, software, firmware, circuits) for producing calibration data for a multi-channel transmitter associated with an MRI apparatus. SAR-mitigation apparatus 699 may also provide means (e.g., hardware, software, firmware, circuits) for controlling the MRI apparatus to transmit RF energy associated with acquiring a magnetic resonance (MR) image of a patient according to the calibration data. Recall that the patient is a special patient that has a conducting material implanted inside or partially inside and partially outside, or even completely outside the patient. Recall also that the RF energy associated with the MRI session will influence the SAR rate near the conducting material associated with the patient. SAR-mitigation apparatus 699 is configured to control a multi-channel transmitter associated with MRI apparatus 600 so that the SAR rate is influenced by less than a desired threshold amount.

The apparatus 600 includes a basic field magnet(s) 610 and a basic field magnet supply 620. Ideally, the basic field magnets 610 would produce a uniform $B_0$ field. However, in practice, the $B_0$ field may not be uniform, and may vary over an object being imaged by the MRI apparatus 600. MRI apparatus 600 may include gradient coils 630 configured to emit gradient magnetic fields like $G_S$, $G_P$ and $G_R$. The gradient coils 630 may be controlled, at least in part, by a gradient coils supply 640. In some examples, the timing, strength, and orientation of the gradient magnetic fields may be controlled, and thus selectively adapted during an MRI procedure.

MRI apparatus 600 may include a set of RF antennas 650 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 650 may be controlled, at least in part, by a set of RF transmission units 660. An RF transmission unit 660 may provide a signal to an RF antenna 650.

The gradient coils supply 640 and the RF transmission units 660 may be controlled, at least in part, by a control computer 670. In one example, the control computer 670 may be programmed to control an IMRI device as described herein. The magnetic resonance signals received from the RF antennas 650 can be employed to generate an image and thus may be subject to a transformation process like a two dimensional FFT that generates pixilated image data. The transformation can be performed by an image computer 680 or other similar processing device. The image data may then be shown on a display 690. While FIG. 6 illustrates an example MRI apparatus 600 that includes various components connected in various ways, it is to be appreciated that other MRI apparatus may include other components connected in other ways.

Figure 7:
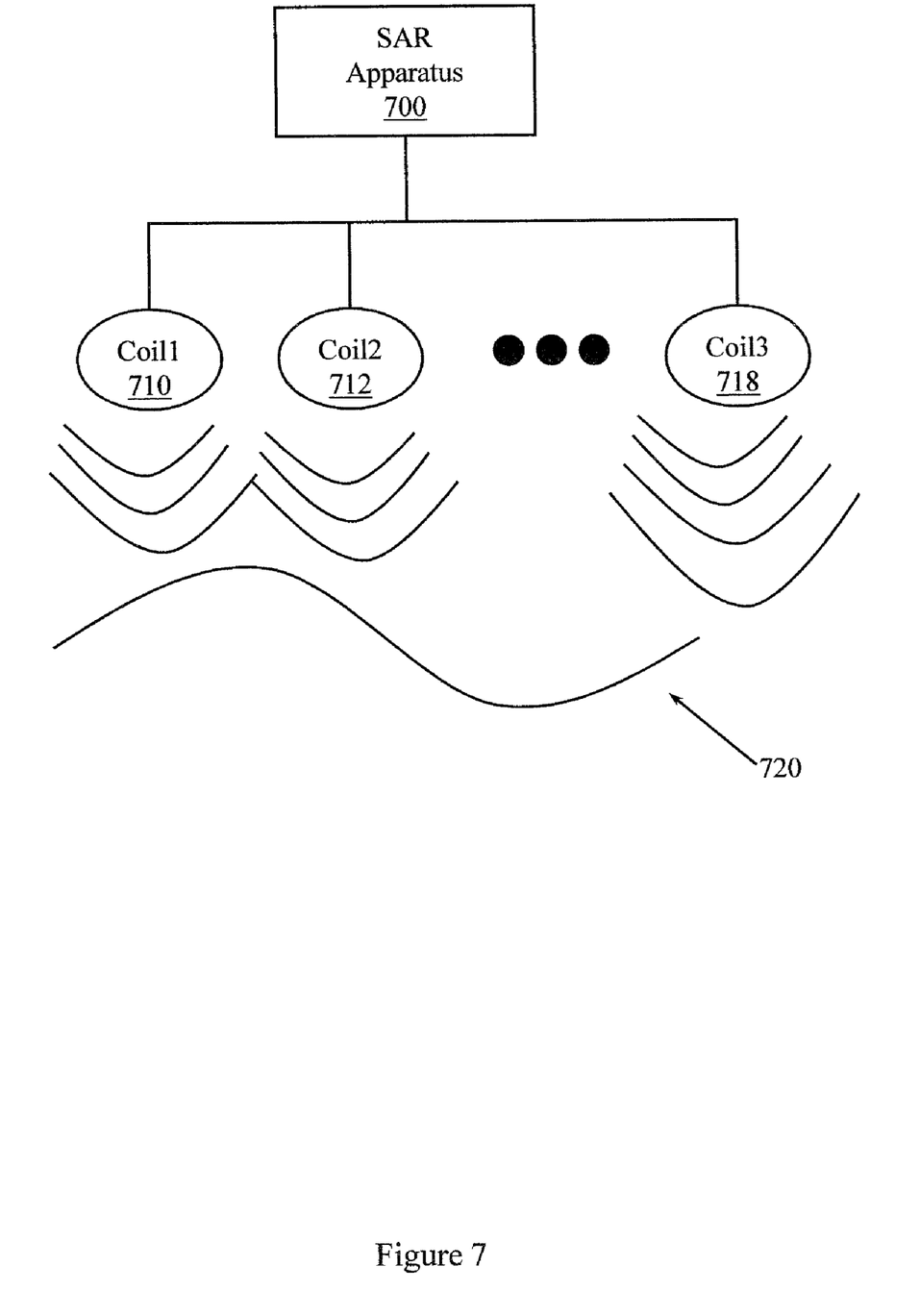
FIG. 7 illustrates an embodiment of a SAR apparatus and a set of transmission coils.

FIG. 7 illustrates an embodiment of an SAR apparatus 700 and a set of transmission coils. The set of transmission coils includes coil1 710, and coil2 712 through coil3 718. One skilled in the art will appreciate that an MRI apparatus may be configured with a multi-channel transmitter. The multi-channel transmitter may have multiple transmission channels. One transmission channel may be associated with each transmission coil. Example systems and methods facilitate identifying sets of transmission parameters for different individual transmission channels and coils so that the effects on SAR can be controlled within a desired tolerance. In FIG. 7, the set of transmission coils are illustrated as all being on one side of a conductor 720. One skilled in the art will appreciate that e-fields produced by RF energy transmitted from the set of coils may induce a signal in the conductor 720. However, calibration of the RF energy with respect to, for example, frequency, amplitude, and bandwidth, may facilitate controlling the signal induced in the conductor.

Figure 8:
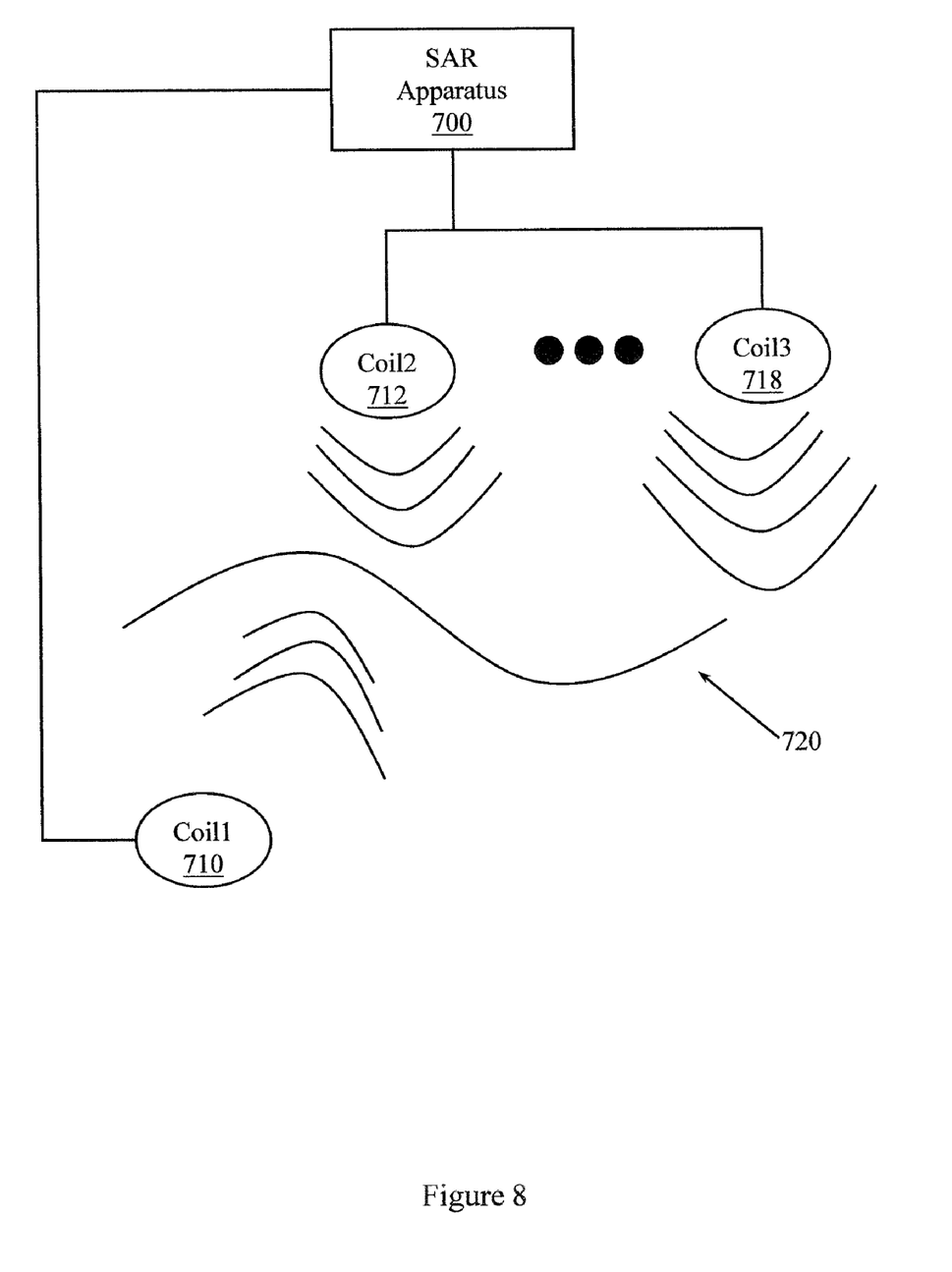
FIG. 8 illustrates an embodiment of a SAR apparatus and a set of transmission coils.

FIG. 8 illustrates another embodiment of SAR apparatus 700 and a set of transmission coils. In this embodiment, one member of the set of coils (e.g., coil1 710) may be on one side of conductor 720 while other members of the set of coils (e.g., coil2 712, coil3 718) may be on another side of conductor 720. One skilled in the art will appreciate that calibration systems and methods described herein can still find combinations of transmission parameters that facilitate reducing negative impacts on SAR by reducing signal induced in conductor 720. One skilled in the art will also appreciate that other arrangements of coils and conductors may be considered and accounted for by calibration apparatus and methods described herein.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A non-transitory computer-readable medium storing computer-executable instructions that when executed by a computer cause the computer to perform a method, the method comprising:
    controlling a magnetic resonance imaging (MRI) apparatus configured with a multi-ring, multi-channel transmitter comprising two or more transmission channels to select an excitation pattern for the transmitter, where transmission channels of the transmitter are individually configurable to transmit radio frequency (RF) energy according to individual transmission parameters, where the excitation pattern describes transmission parameters for RF energy to be transmitted from the individually configurable transmission channels, where the specific absorption rate (SAR) of RF energy near a conductor associated with a patient attributable to the conductor being exposed to a field created by the RF energy is below a threshold amount,
    where coils associated with the multi-ring, multi-channel transmitter are arranged in a configurable pattern along a z-axis associated with the MRI apparatus and have differing sensitivities in the z-direction, where the configurable pattern facilitates establishing a controllable phase relationship between coils in the multi-ring, multi-channel transmitter, where the controllable phase relationship facilitates establishing homogenous excitation; and
    storing the excitation pattern in a computer-readable medium.

2. The non-transitory computer-readable medium of claim 1, the method comprising:
    controlling the MRI apparatus to transmit RF energy through the transmitter according to the excitation pattern.

3. The non-transitory computer-readable medium of claim 1, where the MRI apparatus is configured to acquire an MR image of a portion of the patient as a function of nuclear magnetic resonance (NMR) signal emitted by the patient in response to the excitation pattern.

4. The non-transitory computer-readable medium of claim 3, where the interaction between the RF energy and the conductor is a function of E-fields produced by the transmission of the RF energy, where the E-fields induce a potential in the conductor as described by:

$$V = \int E^* dx$$

where the integral is taken over the path (x) of the wire, and where E represents the E-fields, and
    where applying the RF energy according to the excitation pattern leads to the integral being below a desired amount.

5. The non-transitory computer-readable medium of claim 1, where the excitation pattern is selected based, at least in part, on an electrical potential that would be induced in the conductor in the patient by a set of electric fields produced by the RF energy.

6. The non-transitory computer-readable medium of claim 1, the method comprising:
    controlling the MRI apparatus to transmit RF energy through the transmitter according to a first excitation pattern;
    controlling the MRI apparatus to acquire a first MR signal in response to the first excitation pattern;
    associating a first image quality with the first MR signal;
    associating a first predicted SAR effect with the first MR signal;
    controlling the MRI apparatus to transmit RF energy through the transmitter according to a second excitation pattern;
    controlling the MRI apparatus to acquire a second MR signal in response to the second excitation pattern;
    associating a second image quality with the second MR signal;
    associating a second predicted SAR effect with the second MR signal; and
    selecting a final excitation pattern based, at least in part, on the first image quality, the first predicted SAR effect, the second image quality, and the second predicted SAR effect.

7. The non-transitory computer readable medium of claim 1, where the transmission parameters comprise amplitude, frequency, and bandwidth.

8. The non-transitory computer-readable medium of claim 1, where the conductor associated with the patient is a wire associated with one or more of, an implanted pacemaker, and an implanted neuro-stimulator.

9. The non-transitory computer-readable medium of claim 1, where the coils associated with the multi-ring, multi-channel transmitter are arranged in a spiral pattern, and where signal from at least one transmission channel is inverted with respect to signal from at least one other transmission channel.

10. An apparatus, comprising:
    a calibration logic configured to determine a set of transmission parameters for a set of transmission channels in a multi-ring, multi-channel transmitter,
    where coils associated with the multi-ring, multi-channel transmitter are arranged in a configurable pattern along a z-axis associated with an MRI apparatus, where coils associated with the multi-ring multi-channel transmitter have differing sensitivities in the z-direction, where the configurable pattern facilitates establishing a controllable phase relationship between coils in the multi-ring, multi-channel transmitter, and where the controllable phase relationship facilitates establishing homogenous excitation; and an excitation logic configured to control the multi-channel transmitter to transmit RF energy associated with acquiring a magnetic resonance image of a patient, where the RF energy transmitted through the set of transmission channels according to the set of transmission parameters is configured to induce a signal in a conductor associated with a patient exposed to the RF energy, where the signal is below a configurable threshold; and a data store to store the transmission parameters.

11. The apparatus of claim 10, where the coils associated with the multi-ring, multi-channel transmitter are arranged in a spiral pattern, and where signal from at least one transmission channel is inverted with respect to signal from at least one other transmission channel.

12. The apparatus of claim 10, where the configurable threshold is a specific absorption rate threshold (SAR), where the excitation logic is configured to control the multi-channel transmitter to excite a subset of transmission channels in the multi-channel transmitter in a controlled pattern that compensates for coupling associated with portions of the multi-channel transmitter, and where the excitation logic is configured to control the multi-channel transmitter to produce E-fields that sum to yield a potential on the conductor in the patient that is less than the SAR threshold.

13. The apparatus of claim 10, where the calibration logic is configured to determine the set of transmission parameters for the set of transmission channels, where the transmission parameters are constrained by B1 magnitude and B1 homogeneity.

14. The apparatus of claim 10, where the calibration logic is configured to apply a set of calibration excitation patterns, where the calibration logic is configured to examine a set of resulting impacts on SAR, and where the calibration logic is configured to select an excitation pattern that satisfies a ratio between imaging quality and SAR effects.

15. The apparatus of claim 10, where the transmission parameters comprise amplitude, frequency, and bandwidth.

16. The apparatus of claim 10, where the RF energy induces a signal in the conductor as a function of E-fields produced by the transmission of the RF energy, where the E-fields induce a potential in the conductor as described by:

$$V=\int E^* dx$$

where the integral is taken over the path (x) of the wire, and where E represents the E-fields.

17. The apparatus of claim 10, where the calibration logic, is configured to first determine a set of frequencies for the set of transmission channels in the multi-channel transmitter and then to determine a set of amplitudes for the set of transmission channels in the multi-channel transmitter, where the set of amplitudes are determined in light of the set of frequencies.

18. The apparatus of claim 17, where the calibration logic is configured to determine the set of frequencies and the set of amplitudes using a best-fit approach.

19. The apparatus of claim 10, the apparatus being incorporated in an MRI apparatus.

* * * * *